(12) United States Patent
Bahierathan et al.

(10) Patent No.: US 9,564,379 B2
(45) Date of Patent: Feb. 7, 2017

(54) VIA CHAINS FOR DEFECT LOCALIZATION

(71) Applicants: International Business Machines Corporation, Armonk, NY (US); STMicroelectronics, Inc., Coppell, TX (US)

(72) Inventors: Balasingham Bahierathan, Fishkill, NY (US); Christopher B. D'Aleo, Armeia, NY (US); Gregory M. Johnson, Hopewell Junction, NY (US); Muthukumaraamy Karthikeyan, Fishkill, NY (US); Shenzhi Yang, Yorktown Heights, NY (US)

(73) Assignees: International Business Machines Corporation, Armonk, NY (US); STMicroelectronics, Inc., Coppell, TX (US)

(*) Notice: Subject to any disclaimer, the term of this patent is extended or adjusted under 35 U.S.C. 154(b) by 760 days.

(21) Appl. No.: 13/943,406

(22) Filed: Jul. 16, 2013

(65) Prior Publication Data
US 2013/0299828 A1 Nov. 14, 2013

Related U.S. Application Data

(62) Division of application No. 13/251,352, filed on Oct. 3, 2011, now Pat. No. 8,546,155.

(51) Int. Cl.
*H01L 23/58* (2006.01)
*H01L 21/20* (2006.01)
*H01L 21/66* (2006.01)

(52) U.S. Cl.
CPC .............. *H01L 22/30* (2013.01); *H01L 22/14* (2013.01); *H01L 22/20* (2013.01); *H01L 22/34* (2013.01)

(58) Field of Classification Search
CPC ... H01L 23/49827; H01L 23/544; H01L 22/14
USPC ... 257/48, 528, 621, 532, 620, 737, 59, 390, 257/797, E21.321, E21.527, E21.53; 438/387, 667, 618, 674, 666
See application file for complete search history.

(56) References Cited

U.S. PATENT DOCUMENTS

| | | | |
|---|---|---|---|
| 6,303,899 B1 * | 10/2001 | Johnson | H01L 23/544 219/121.68 |
| 2005/0023648 A1 | 2/2005 | Jung et al. | |
| 2005/0139826 A1 * | 6/2005 | Nasuno | H01L 22/34 257/48 |
| 2006/0044001 A1 | 3/2006 | Cano et al. | |
| 2009/0201043 A1 * | 8/2009 | Kaltalioglu | G01R 31/2858 324/750.3 |

OTHER PUBLICATIONS

Office Action Communication, U.S. Appl. No. 13/251,352, pp. 1-7, Feb. 20, 2013.
Notice of Allowance Communication, U.S. Appl. No. 13/251,352, pp. 1-14, May 24, 2013.

* cited by examiner

*Primary Examiner* — Julio J Maldonado
*Assistant Examiner* — Moin Rahman
(74) *Attorney, Agent, or Firm* — Gibb & Riley, LLC; Steven J. Myers, Esq.

(57) ABSTRACT

Via chain and serpentine/comb test structures are in kerf areas of a wafer. The via chain test structures comprise a first via chain and a second via chain in a first kerf area. The via chain test structures are formed such that geometrically shaped portions of the first via chain and geometrically shaped portions of the second via chain alternate along the length of the first kerf area.

15 Claims, 11 Drawing Sheets

VIA CHAINS FOR DEFECT LOCALIZATION

CROSS REFERENCE TO RELATED APPLICATION

The present invention claims the benefit under 35 U.S.C. §120 as a divisional of presently pending U.S. patent application Ser. No. 13/251,352 filed on Oct. 3, 2011, issued as U.S. Pat. No. 8,546,155, the entire teachings of which are incorporated herein by reference.

BACKGROUND

The embodiments herein relate to the design of via chains and serpentine/comb testable structures, and more specifically, to structures and methods that save time and are less destructive when testing via structures.

An integrated circuit (IC) is a semiconductor device containing many small, interconnected components such as diodes, transistors, resistors, and capacitors. These components function together to enable the IC to perform a task, such as control an electronic device or perform logic operations. ICs are found in computers, calculators, cellular telephones, and many other electronic devices.

ICs and other semiconductor devices are fabricated on small rectangles, known as "dies," which are filled with multiple layers of the components, such as transistors, resistors, and capacitors, during the fabrication process. The connections between the layers are known as vias. A via is a metal interconnect coupled between two planar conductive layers in a semiconductor die. Multiple vias may be coupled together in what may be referred to as a "via chain" connecting one conductive region in an IC to another conductive region.

A manufacturing error in one of the components mentioned above may render an IC or semiconductor device incapable of functioning properly. For example, consider a memory device containing several ICs. If a transistor within one of the ICs fails to function properly, the memory device may produce memory errors. Vias are also subject to manufacturing errors. When a manufacturing error occurs in a via, the via may not conduct properly and thus may prohibit an IC from functioning correctly. For instance, an open via or a partially open via may prohibit a device from functioning as designed. An open via may have a high or infinite resistance, and a partially open via may have a higher than average resistance. Therefore, testing via structures is a fundamental aspect of IC production. The embodiments also relate to in-plane structures as well.

SUMMARY

An exemplary method herein forms via chain test structures in kerf areas of a wafer. The via chain test structures comprise a first via chain and a second via chain in a first kerf area. The via chain test structures are formed such that geometrically shaped portions of the first via chain and geometrically shaped portions of the second via chain alternate along the length of the first kerf area.

The methods herein perform relatively low magnification (sometimes referred to herein as "first magnification") failure analysis to identify a defective geometrically shaped portion that contains a defective via structure. The methods then perform relatively high magnification (sometimes referred to herein as "second magnification") defect localization only within the defective geometrically shaped portion. The first magnification testing is therefore performed at a lower magnification relative to the second magnification testing. This saves time and is less destructive because the relatively high magnification defect localization is slower and potentially more destructive to the kerf areas than the relatively low magnification defect localization.

Another exemplary method herein simultaneously manufactures integrated circuit chips on a wafer and forms via chain test structures in kerf areas of the wafer. The kerf areas of the wafer are located between the integrated circuit chips. The methods herein test the via chain test structures. After testing the via chain test structures, the methods herein divide the wafer to separate the integrated circuit chips from each other in a process that destroys the kerf areas.

The via chain test structures comprise a first via chain and a second via chain in a first kerf area. The via chain test structures are formed such that geometrically shaped portions of the first via chain and geometrically shaped portions of the second via chain alternate along the length of the first kerf area.

The failure analysis process performs relatively low (first) magnification defect localization to identify a defective geometrically shaped portion that contains a defective via structure. The failure analysis then performs relatively high (second) magnification testing only within the defective geometrically shaped portion. The first magnification testing is therefore performed at a lower magnification relative to the second magnification testing. This saves time and is less destructive because the relatively high magnification localization takes longer and may be more destructive to the kerf areas than the relatively low magnification localization.

A wafer structure according to embodiments herein includes integrated circuit chips and kerf areas located between the integrated circuit chips. Also, via chain test structures are located in the kerf areas. The via chain test structures include a first via chain and a second via chain located in a first kerf area. Geometrically shaped portions of the first via chain and geometrically shaped portions of the second via chain alternate along a length of the first kerf area. The first via chain comprises a first electrical circuit beginning and ending at a first location within the first kerf area, and similarly the second via chain comprises a second electrical circuit that also begins and ends at the first location within the first kerf area.

BRIEF DESCRIPTION OF THE DRAWINGS

The embodiments will be better understood from the following detailed description with reference to the drawings, which are not necessarily drawing to scale and in which.

DETAILED DESCRIPTION

As mentioned above, electrical test and failure analysis of via and/or snake structures are a fundamental aspect of IC production. The embodiments herein provide structures and methods that save time and may be less susceptible to potential damage when localizing defects in failure analysis.

Vias in a semiconductor device may be tested by measuring the resistance of via test chains. This technique identifies via chains containing open vias and some partially open vias by their high resistance. The test module may be located in the kerf region surrounding the semiconductor die. The kerf regions are areas where semiconductor wafer will be cut to separate individual semiconductor dies when the fabrication process is complete. Semiconductor test structures in semiconductor dies or kerf regions contain a plurality of vias. Vias are conductors that electrically connect one layer of an integrated circuit to another layer. Vias may be connected together to form a via chain. The via chain connects layers of components in the semiconductor test structure. Each layer contains a plurality of conductive plates. Each plate couples to at least one other plate by one of the vias.

It is relatively easy to localize defects in macros with very small areal coverage; however, in order to achieve defect density process targets, it is often necessary to make extremely large arrays with links. It is natural that in these larger via chains it would be difficult to locate defects (localize defects).

Figure 1:
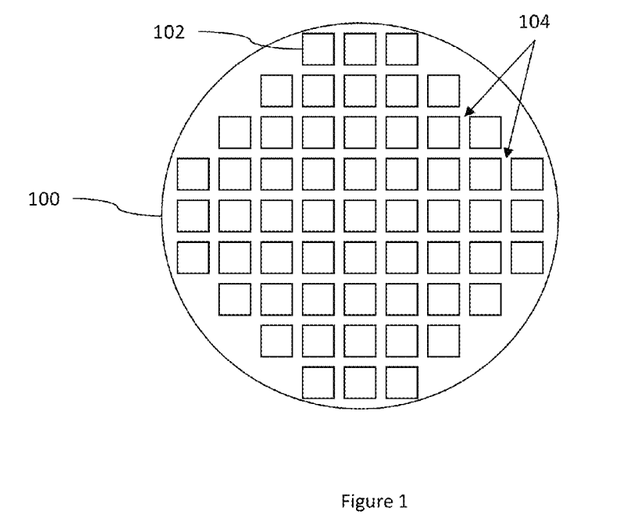
FIG. 1 is a top view schematic diagram illustrating a wafer according to embodiments herein.
Figure 2:
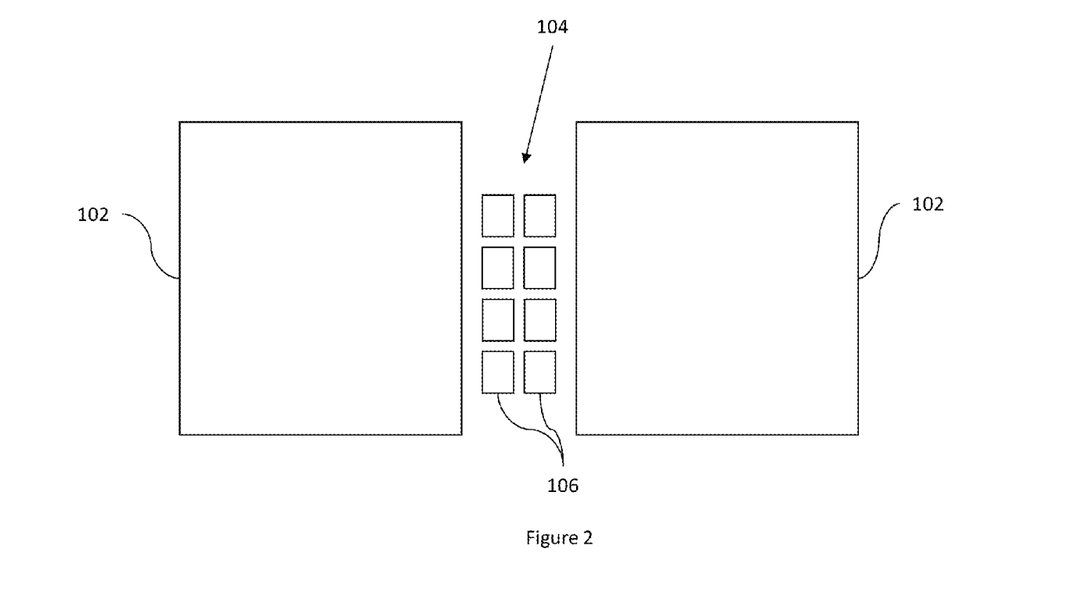
FIG. 2 is a top view schematic diagram illustrating via chains according to embodiments herein.

Referring now to the drawings, FIG. 1 is a top-view schematic illustration showing a wafer 100 structure that includes integrated circuit chips 102 and kerf areas 104 located between the integrated circuit chips 102. FIG. 2 is also a top-view schematic illustration of an enlarged portion of the structure shown in FIG. 1. More specifically, FIG. 2 illustrates via chain test structures 106 that are located in a kerf area 104.

Figure 3:
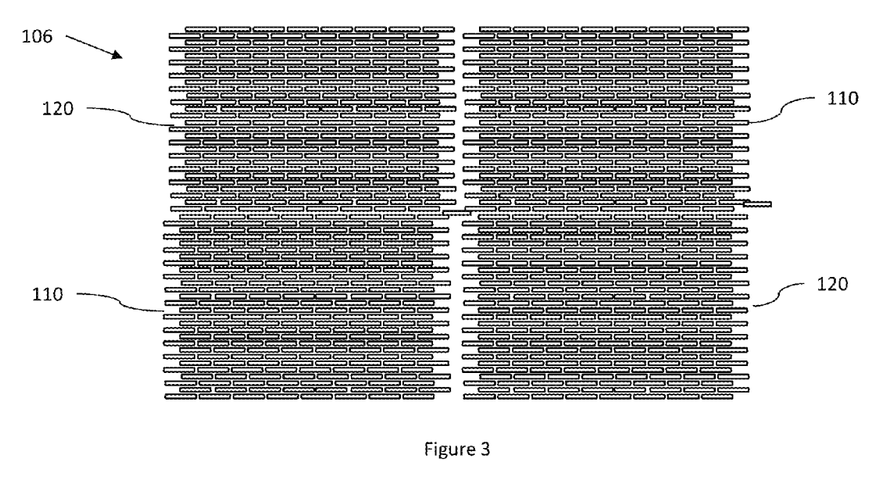
FIG. 3 is a top view schematic diagram illustrating via chains according to embodiments herein.

FIG. 3 is a top enlarged view of the via chain test structures 106 shown in FIG. 2. As shown in FIG. 3, the via chain test structures 106 include a first via chain 110 and a second via chain 120 located in one of the kerf areas, which is arbitrarily referred to herein as a "first" kerf area 104. As shown in the conceptual drawing in FIG. 4, the geometrically shaped portions 112 of the first via chain 110 and geometrically shaped portions 122 of the second via chain 120 alternate along a length of the first kerf area 104. The same structure, where the geometrically shaped portions 112 of the first via chain 110 and geometrically shaped portions 122 of the second via chain 120 alternate along a length of the first kerf area 104, is shown somewhat more schematically in FIG. 5.

Thus, as shown here there can be two types of via chains: i) via chains, which alternate, in squares (& other shapes), by type, across two or more layers of the chip; and ii) serpentine/comb structures which alternate in type or instance in the same plane of the chip. These are referred to as "comb" structures because they are shaped like the teeth of a comb. For example, considering FIG. 4, above, the via chains, which alternate, in squares (& other shapes), by type, across two or more layers of the chip is shown where the path of the squiggly lines represent two different via chains. The serpentine/comb structures which alternate in type or instance in the same plane of the chip are shown where the one color line is, say RX (AKA, active area) and the other color line is PC (AKA gate).

Figure 4:
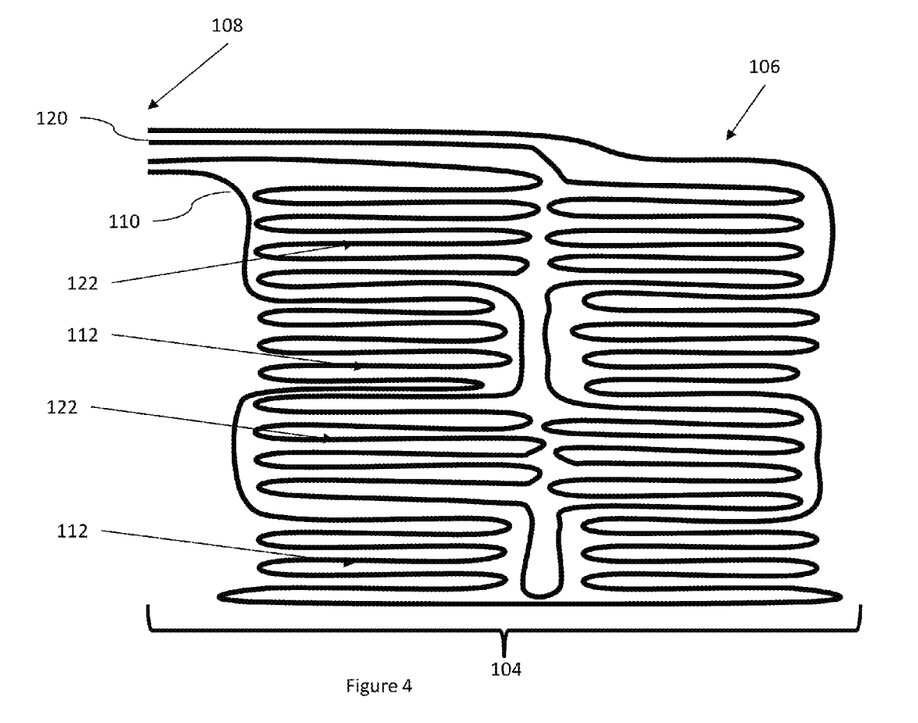
FIG. 4 is a top view schematic diagram illustrating via chains according to embodiments herein.
Figure 5:
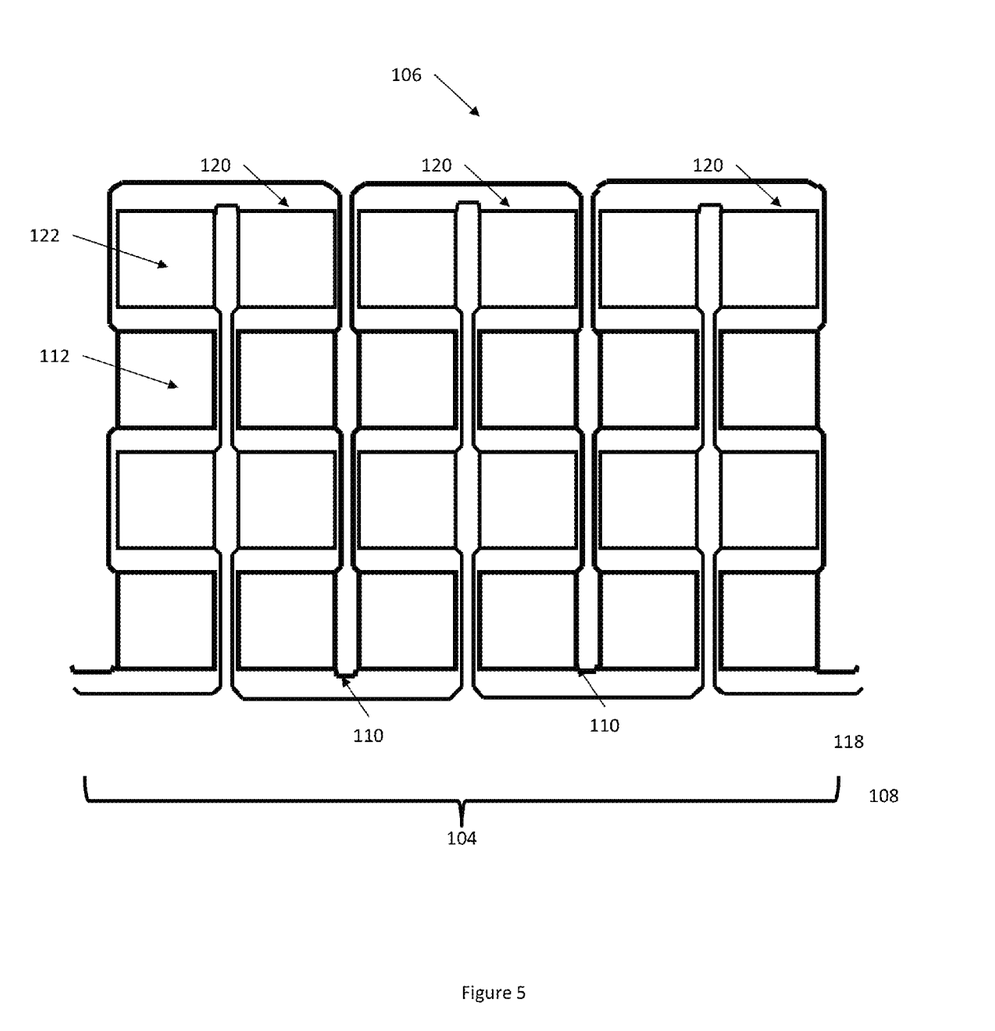
FIG. 5 is a top view schematic diagram illustrating via chains according to embodiments herein.

Despite the conceptually different ways FIGS. 3-5 illustrate the structure, in the embodiments herein, the first via chain 110 is electrically insulated from the second via chain 120. Further, the first via chain 110 comprises a first electrical circuit beginning and ending at a first location 108 within the first kerf area 104, and similarly the second via chain 120 comprises a second electrical circuit that also begins and ends at the first location 108 within the first kerf area 104.

While a single beginning/ending location 108 is illustrated in FIG. 4, as would be understood by those ordinarily skilled in the art, each via chain circuit could have a beginning positioned at a different location than the ending. Therefore, in FIG. 5 a beginning location 108 and an ending location 118 are illustrated for the second via chain 120 circuit. In order to avoid clutter in FIG. 5, some additional wiring of the first via chain 110 circuit has intentionally been omitted. However, as is illustrated in FIGS. 3-5, each via chain circuit includes a beginning, an ending, and a plurality of geometrically shaped groupings of via structures that alternate with other geometrically shaped portions of other via chains.

While the foregoing examples have discussed only two via chains, those ordinarily skilled in the art would understand that the number of via chains is not limited and any of the embodiments herein could include a large number of via chains, but such large numbers are not illustrated, simply for ease of illustration and to simplify understanding. In one example shown in FIGS. 6A-6C, three different via chains 110, 120, 130 are shown in a cross-sectional schematic (FIG. 6A); perspective cross-sectional schematic (FIG. 6B); and perspective elevated-view schematic (FIG. 6C).

Figure 6A:
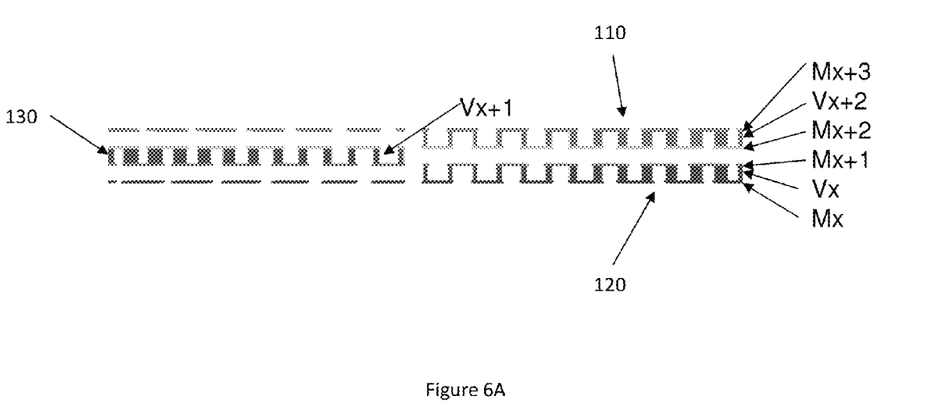
FIG. 6A is a side view schematic diagram illustrating via chains according to embodiments herein.

More specifically, FIG. 6A illustrates three different conductor layers ($M_x$, $M_{x+1}$, and $M_{x+2}$) within an integrated circuit structure, and three different via layers ($V_x$, $V_{x+1}$, and $V_{x+2}$) that connect the different conductor layers together. Therefore, as shown in FIG. 6A, the first via chain 110 includes vi$_{as}$ $V_{x+2}$ that connect conductor layer $M_{x+3}$ and conductor layer $M_{x+2}$. Similarly, the second via chain 120 includes vias $V_x$ that connect conductor layer $M_{x+1}$ and conductor layer $M_x$. Also, the third via chain 130 includes vias $V_{x+1}$ that connect conductor layer $M_{x+2}$ and conductor layer $M_{x+1}$.

Figure 6B:
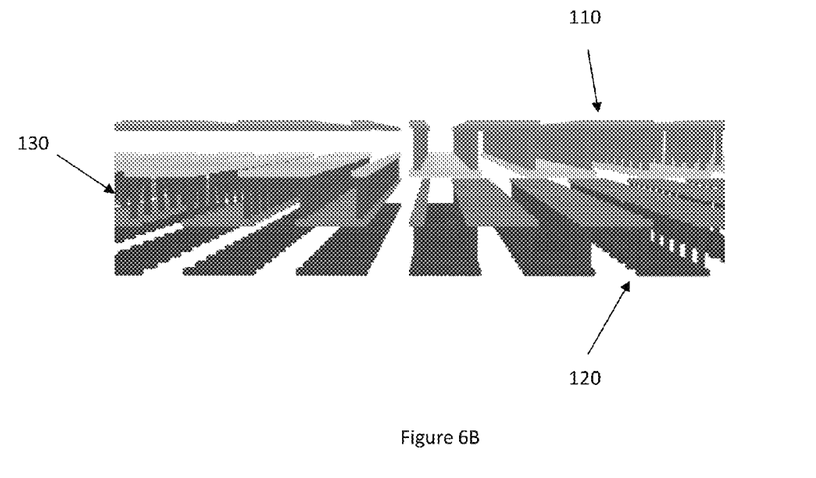
FIG. 6B is a perspective view schematic diagram illustrating via chains according to embodiments herein.
Figure 6C:
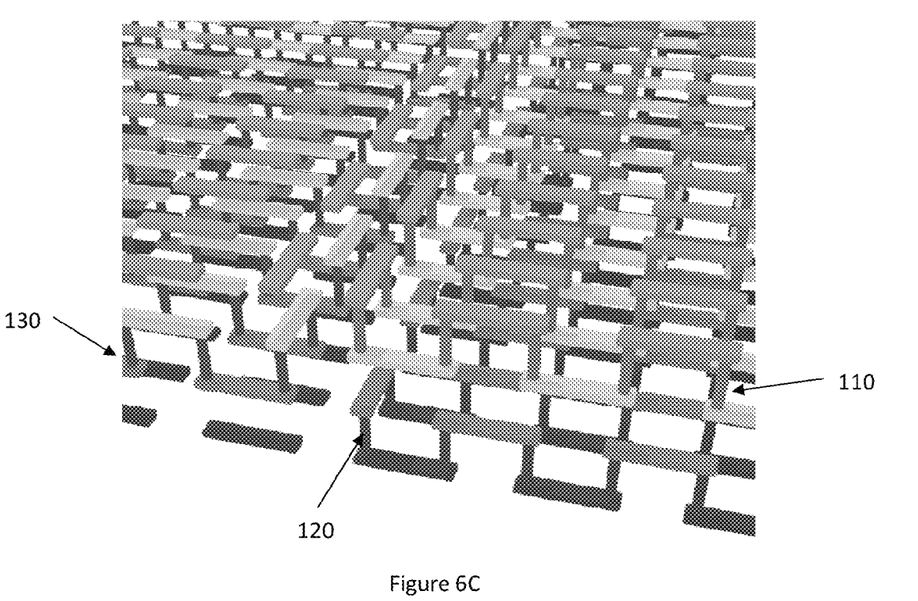
FIG. 6C is a perspective view schematic diagram illustrating via chains according to embodiments herein.

In order to avoid cluttering the drawings, FIGS. 6A-6C only illustrate a single geometrically shaped portion of each of the via chains 110, 120, 130; however, those ordinarily skilled in the art would understand that each of the via chains 110, 120, 130 illustrated in FIGS. 6A-6C, is electrically insulated from the other via chains, and each via chain comprises an electrical circuit having multiple ones of the geometrically shaped portions. Further, each of the via chains is connected to wiring that allows each via chain to be tested from a single location (or from two locations).

Figure 7:
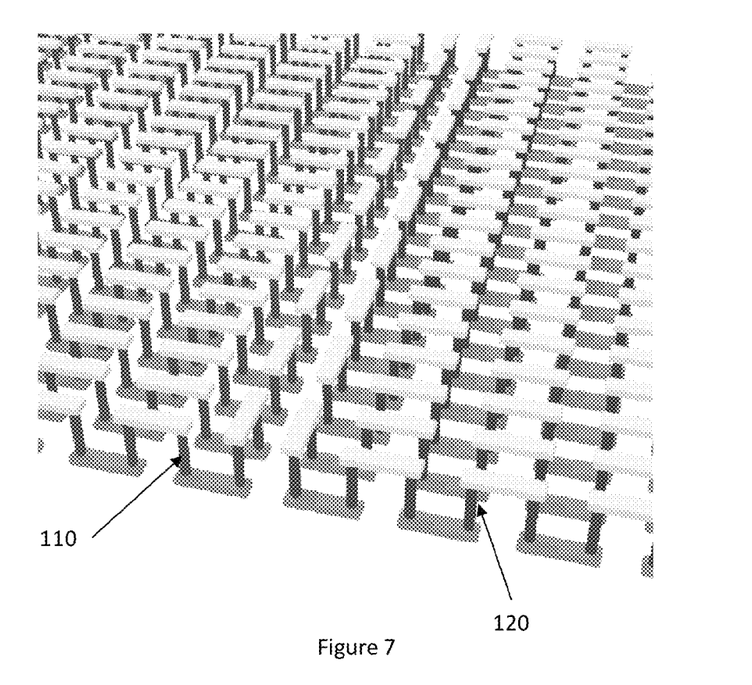
FIG. 7 is a perspective view schematic diagram illustrating via chains according to embodiments herein.

While FIGS. 6A-6C illustrate that the via chains can be on different levels within the integrated circuit structure, FIG. 7 is an elevated perspective view illustrating the first via chain 110 and the second via chain 120 positioned within the same levels of an integrated circuit structure. FIG. 7 is therefore very similar to the structure shown in FIGS. 3-5, discussed above, and illustrates such structures in perspective view.

Figure 8:
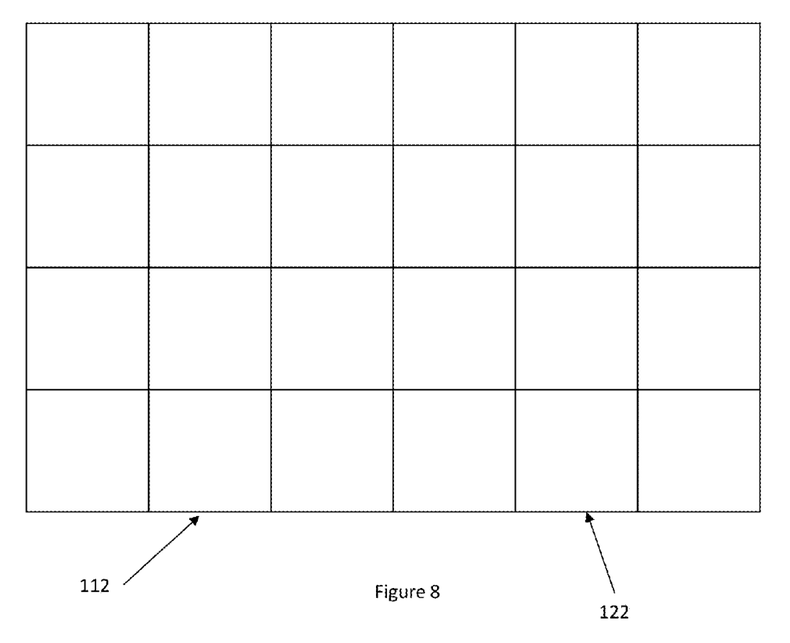
FIG. 8 is a top view schematic diagram illustrating via chains according to embodiments herein.
Figure 9:
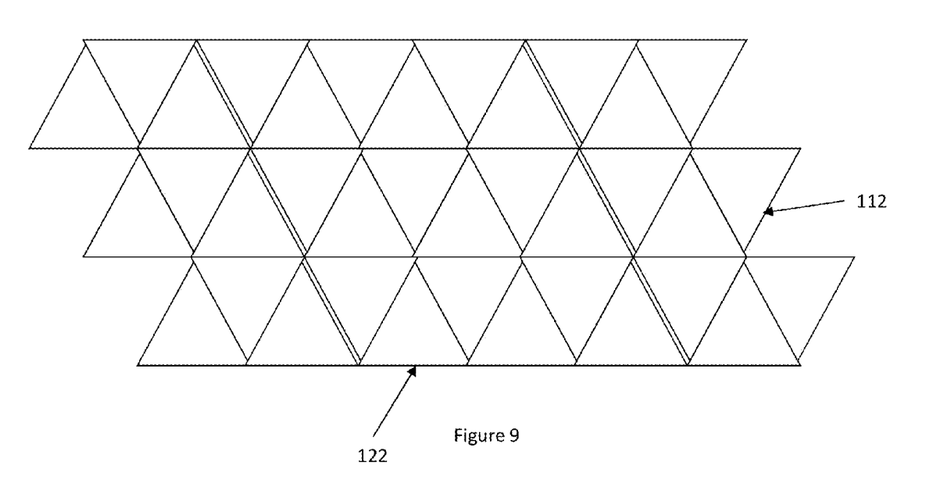
FIG. 9 is a top view schematic diagram illustrating via chains according to embodiments herein.
Figure 10:
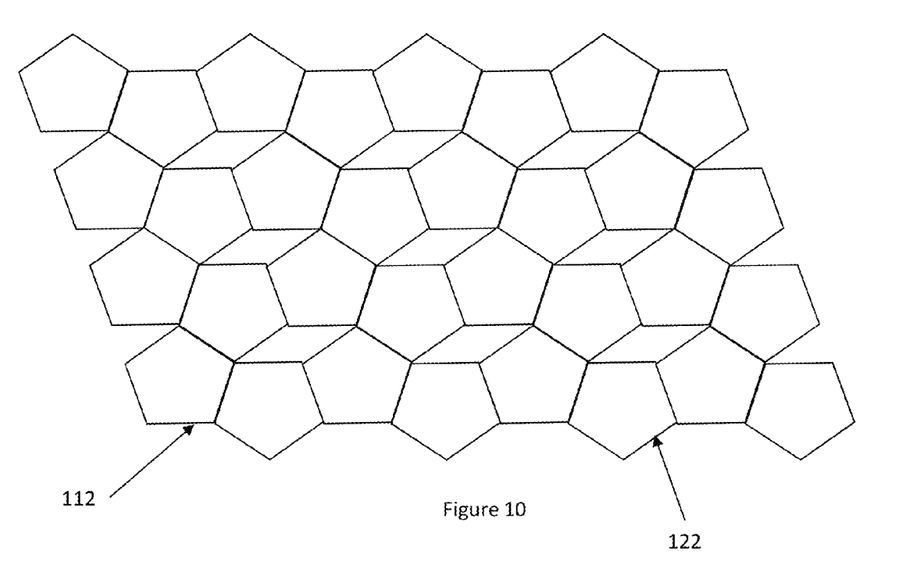
FIG. 10 is a top view schematic diagram illustrating via chains according to embodiments herein.
Figure 11:
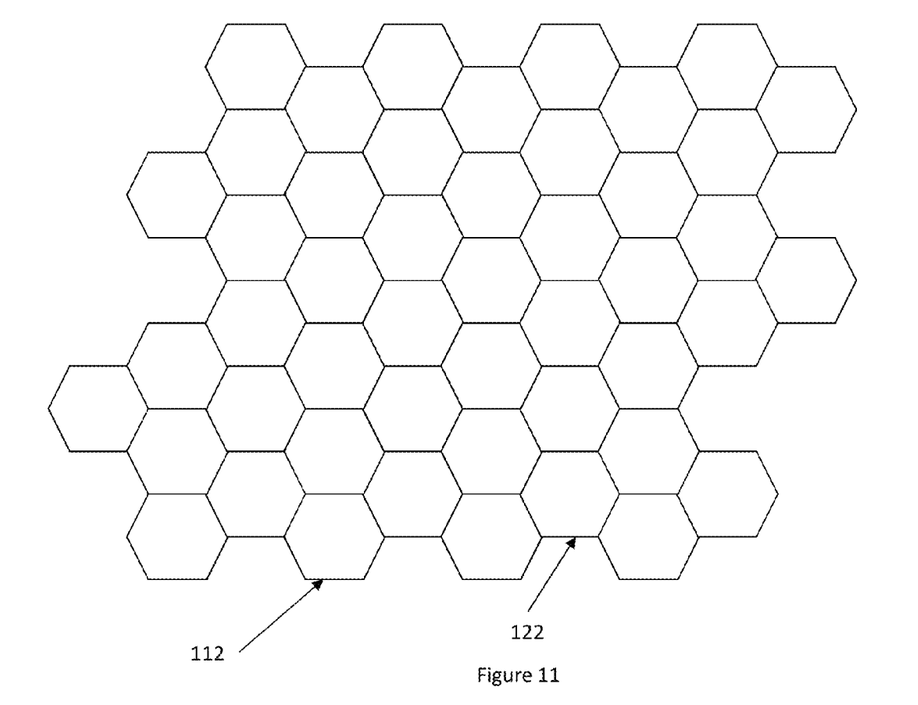
FIG. 11 is a top view schematic diagram illustrating via chains according to embodiments herein.

The geometrically shaped portions 112, 122 can be of any desired shape including, but not limited to triangles, rectangles, pentagons, hexagons, heptagons, octagons, circles, ovals, etc., and a few of these shapes are illustrated in FIGS. 8-11. Note that in FIGS. 8-11, only the geometric portions 112, 122 containing multiple via structures are illustrated, and all wiring and other associated structures are omitted in order to avoid clutter. Therefore, FIG. 8 illustrates square geometric portions 112, 122 that can be positioned in a checkerboard arrangement. Similarly, FIG. 9 illustrates triangle geometric portions 112, 122, FIG. 10 illustrates pentagon geometric portions 112, 122, and FIG. 11 illustrates hexagon geometric portions 112, 122. While the drawings illustrate a limited number of shapes, those ordinarily skilled in the art would understand that many more shapes could be utilized for the geometric portions 112, 122 and that the shapes shown here are merely illustrative and do not limit the embodiments to these specific shapes.

The structures shown above are used to save time and reduce destructive effects when testing and when performing defect localization via structures. More specifically, as shown in flowchart form in FIG. 12, in item 200 an exemplary method herein simultaneously manufactures integrated circuit chips on a wafer and forms via chain test structures in kerf areas of the wafer. The methods herein test the via chain test structures in item 202-204. After testing the via chain test structures, in item 206 the methods herein divide the wafer to separate the integrated circuit chips from each other in a process that destroys the kerf areas.

As shown above, the via chain test structures 106 comprise a first via chain 110 and a second via chain 120 in the kerf area 104. The via chain test structures 110, 120 are formed such that geometrically shaped portions 112 of the first via chain 110 and geometrically shaped portions 122 of the second via chain 120 alternate along the length of the kerf area 104.

Figure 12:
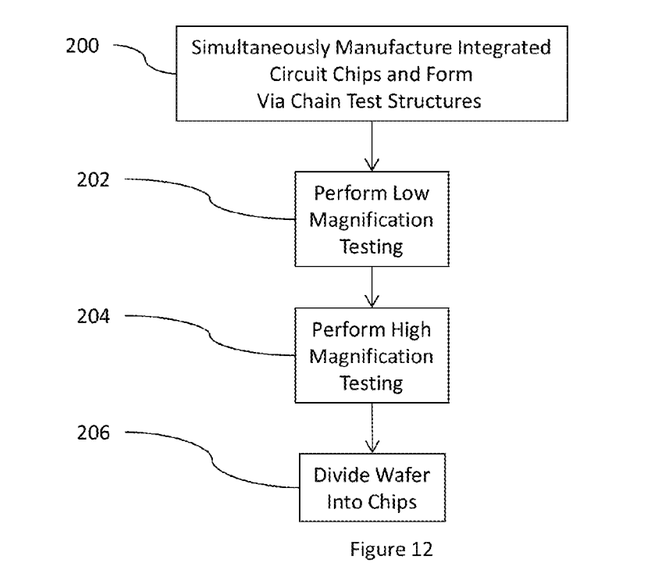
FIG. 12 is a flow diagram illustrating embodiments herein.

The testing process takes advantage of this structure and first performs relatively low power, low magnification testing (sometimes referred to herein as "first magnification testing") in item 202 to quickly and non-destructively identify whether any defective vias are present and, if they are, to identify at least one defective geometrically shaped portion that contains a least one defective via structure.

One benefit here is in defect localization in failure analysis. Therefore, the defect localization may regionalize the area of a defect in an analysis like Focused Ion Beam, Externally Induced Voltage Alteration, or Optical Beam Induced Current. A low magnification scan in the failure analysis localization (not in "testing") can quickly identify the region of the defect. This has two benefits. i) for all localization techniques, it greatly saves analysis time and increases the chance that the localization will provide useful information to find the point defect; ii) in some localization techniques, such as Focused Ion Beam (FIB), the scanning of the image itself can be destructive. Therefore, minimizing the number of high-magnification scans that need to be done provides great benefit in not destroying the sample before the defect is found).

In item 204, the testing process then performs relatively high power, high magnification testing (sometimes referred to herein as "second magnification testing") only within the defective geometrically shaped portion(s). The first magnification testing is performed at a lower magnification relative to the second magnification testing. This saves time and is less destructive because the relatively high magnification testing takes longer and is more destructive to the kerf areas than the relatively low magnification testing. By limiting the relatively high magnification testing to only those geometrically shaped portions that have been identified as being defective geometrically shaped portions, less of the slower, more destructive testing is preformed, thereby saving time and reducing destruction.

Testing techniques include focused ion beam (FIB) testing, laser voltage imaging, magnetically scanned beam, scanning electron microscopy, optical microscopy, Energy Dispersive X-Ray Spectroscopy (EDS) etc. In one of these methods, FIB for example, FIB systems operate in a similar fashion to a scanning electron microscope (SEM) except, rather than a beam of electrons and as the name implies, FIB systems use a finely focused beam of ions (usually gallium) that can be operated at low beam currents for imaging or high beam currents for site specific sputtering or milling.

An exemplary FIB unit generally contains a liquid metal ion source using gallium (Ga) to generate a Ga ion beam. A lens system focuses the ion beam to a spot size on the test area of the wafer which is placed on a stage. A set of scan coils is placed in the vicinity of the lens system. When energized, the scan coils direct the ion beam to scan over a predetermined area. The output of ion source, lens system focusing, and scan coil actions are controlled by an ion beam control unit.

During FIB testing, images produced show portions of the via scan chain that are electrically conductive as having a contrast relative to those portions that are not electrically conductive. Therefore, during low magnification testing, each geometrically shaped portion of each scan chain will either show contrast or not show contrast.

Figure 13:
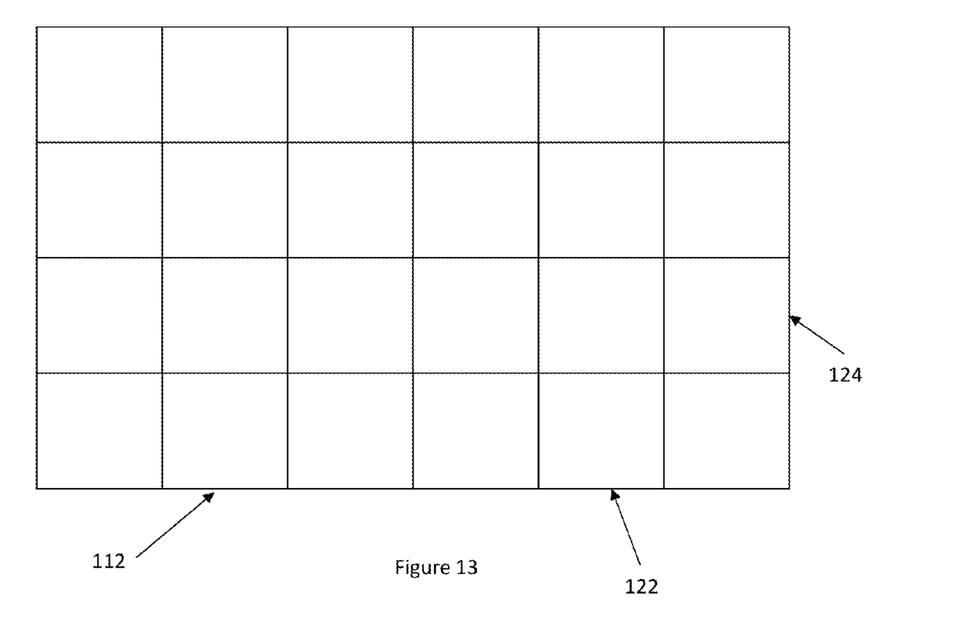
FIG. 13 is a top view schematic diagram illustrating via chains according to embodiments herein.

For example, in FIG. 13 (which is the same structure shown in FIG. 8) the image produced by low magnification FIB testing shows some of the geometrically shaped portions 122 of the second via chain 120 having contrast (brighter color) and other not having the contrast. Specifically, if testing proceeded from the top left down toward the bottom right, geometrically shaped portion 124 is the first geometrically shaped portion that does not show contrast. This indicates that geometrically shaped portion 124 is a defective geometrically shaped portion (as would be indicated during item 202 in FIG. 12). Similar testing can be done in a different order, such as from bottom to top, etc., (or at different powers) to locate other defective geometrically shaped portions.

Figure 14:
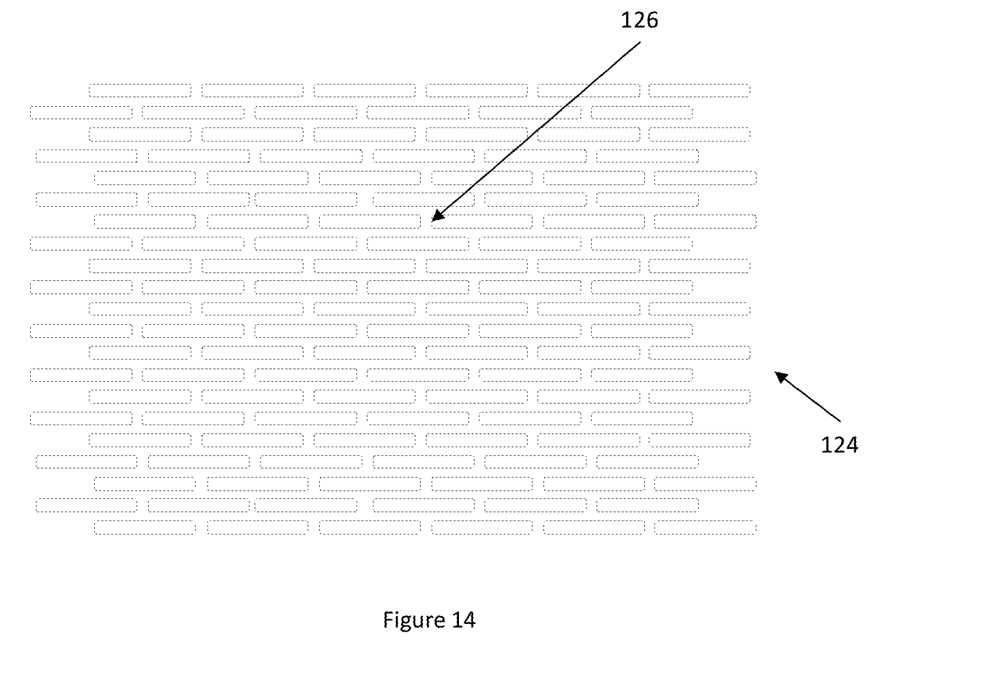
FIG. 14 is a top view schematic diagram illustrating via chains according to embodiments herein.

Then, as indicated in item 204 in FIG. 12, relatively high power, high magnification testing is performed only within the defective geometrically shaped portion 124. This is illustrated in FIG. 14, which is a top view schematic diagram illustrating a small part of the via scan chain within geometrically shaped portion 124. As shown by the change in contrast at point 126, the via scan chain within geometrically shaped portion 124 is broken at point 126.

Figure 15:
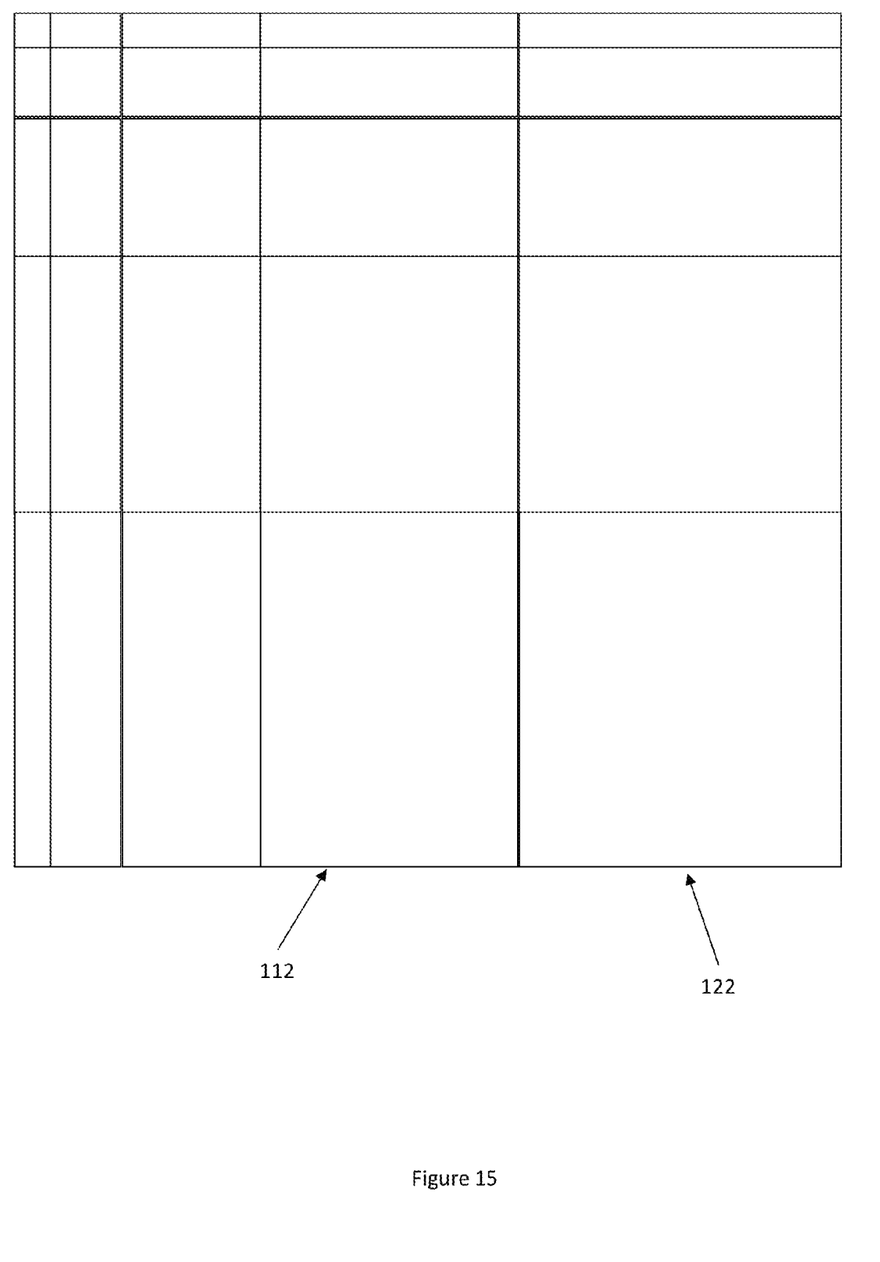
FIG. 15 is a top view schematic diagram illustrating via chains according to embodiments herein.
Figure 16:
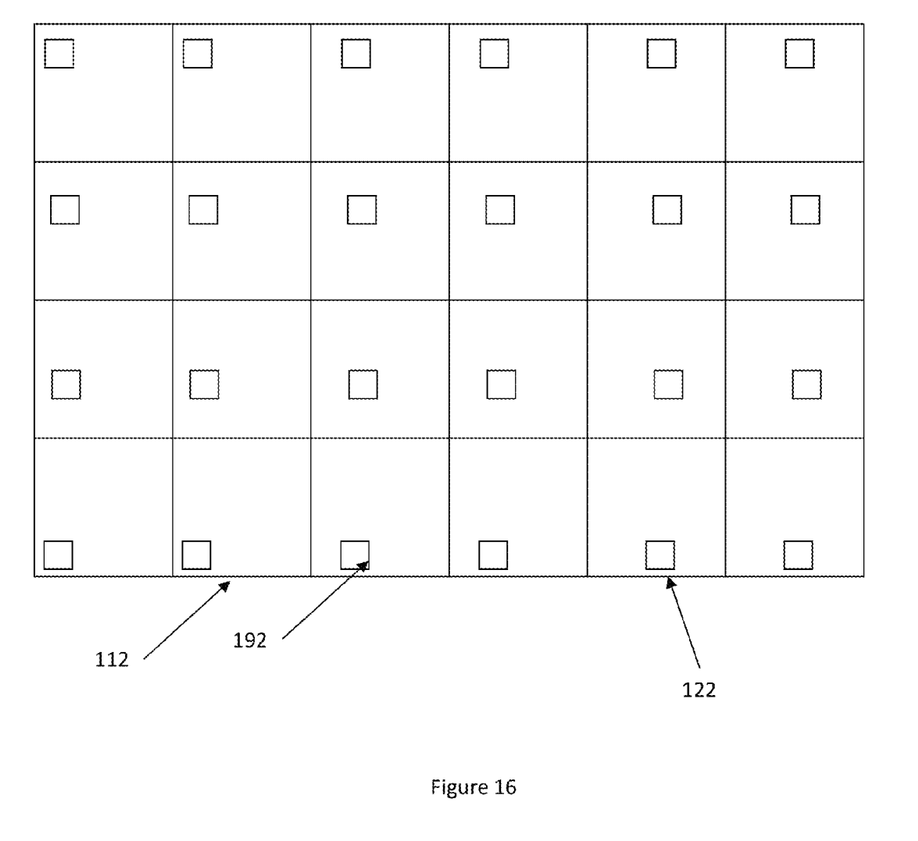
FIG. 16 is a top view schematic diagram illustrating via chains according to embodiments herein.

The above-shown features allow for a benefit in localization making use of patterns which allow for a regionalization at low magnification scanning, which is then followed by high-magnification scanning. However, as shown in FIGS. 15 and 16, the embodiments further allow for the use of high-magnification images to show precisely where one is when the defect is localized. This is of particular benefit in large macros or in cases where the features of the macro are capable of being damaged by even the low-magnification scanning.

More specifically, such features herein include a grid similar to that in FIG. 8 where the alternating squares (112, 122) of via chain type 1 and 2, except that the X and Y dimensions of the rectangles vary across the arrays as shown in FIG. 15. The dimension of the rectangles may decrease and increase in several waves as one goes from one edge of the macro to the other.

Identifying marks or changes in the pattern within the squares 112, 122 give information as to the coordinates of the square. These features are shown in FIG. 16, where the identifying mark 192 can be made with either a block of "no pattern" (i.e., dielectric), some other material, or the "alternate" via serpentine type.

The power of the FIB testing can be performed at any power level, which will vary with the item being tested. For example, FIB localization often involves use of 30 kV Ga. However, the high power, high magnification testing is at least 10 times higher than the low power, low magnification testing (and can be 10; 100; 1000; 10,000; etc., times higher power). This increase in power required for the higher magnification testing is proportionately more destructive on the item being tested (e.g., can erode away min-dimension copper). More specifically, the focused ion beam can sputter away delicate material and/or implant Ga+ ions into the sample (creating electrical shorts), causing more damage with more imaging time. This destructive effect is greater with greater magnification. Therefore, by limiting such high power, high magnification testing to only the previously identified defective geometrically shaped portions, the amount of damage to the kerf region as a whole is dramatically reduced (when compared to performing high magnification testing on the entire via chain from beginning to end).

In addition, the process of focused ion beam testing of each individual via in the high magnification testing is time consuming as the relatively narrow beam used in high magnification testing is directed to each via sequentially. To the contrary, when performing the low magnification testing with a wider beam, each geometrically shaped portion is tested as a single item. In other words, the lower magnification testing uses a test beam large enough to cover an entire geometrically shaped portion of via chain, while the high magnification testing uses a more narrow beam that is focused down to a size as small as a single via. Also, between the low and high magnification, the rate of milling of surface material greatly increases, such that it takes great skill not to destroy the area of interest with just a few scans. Thus, it takes the same amount of time to test an entire geometrically shaped portion with a wider focused beam as it does to test a single via under higher magnification testing with a more narrowly focused beam. In this way, the low magnification testing allows more vias to be tested more quickly, and the slower high magnification testing is reserved for the smaller previously located defective geometrically shaped portions. The appearance of the voltage contrast of the low and high magnification testing is similar, but in order to find the actual failing link, you will need to scan a considerable portion of the chain at high magnification, and there is a risk of destroying your sample before you have determined the failing link.

Therefore, all geometrically shaped portions can be tested very quickly (e.g., 10; 100; 1000; 10,000; etc., times faster than the time needed for focused ion beam testing of each individual via in the high magnification testing) and the slower high magnification testing that proceeds via-by-via is used only in the previously identified defective geometrically shaped portions. By using the slower high magnification testing only in the previously identified defective geometrically shaped portions the testing time of the kerf region as a whole is dramatically reduced (when compared to performing high magnification testing on the entire via chain from beginning to end).

Further, in very large via chains, it is difficult to find the defect for marking if it is located in the center of an extremely large array. This problem is solved here because the embodiments herein perform high magnification testing only in the previously identified defective geometrically shaped portions (which can be designed small enough to allow easy location (localization) of the defect).

Thus, the embodiments described herein allow for the localization signal itself to be seen at low magnification as a grid of checkerboard squares within the larger matrix. This permits one to drive quickly to the place of interest, from low magnification to high magnification, simply by driving to squares. Further, after the defect has been localized (especially in the case of non-destructive techniques) the mark may be found rapidly, by counting off squares.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the embodiments for various embodiments with various modifications as are suited to the particular use contemplated.

What is claimed is:

1. A wafer structure comprising:
   integrated circuit chips;
   kerf areas located between said integrated circuit chips; and
   via chain test structures in said kerf areas,
   said via chain test structures comprising a first via chain and a second via chain located in a first kerf area,
   geometrically shaped portions of said first via chain and geometrically shaped portions of said second via chain alternating along a length of said first kerf area,
   said first via chain being electrically insulated from said second via chain to allow relatively lower magnification testing to identify a defective geometrically shaped portion containing a defective via structure, and relatively higher magnification testing to be performed only within said defective geometrically shaped portion,
   said relatively high magnification testing is slower and more destructive than said relatively low magnification testing,
   said first via chain comprising a first electrical circuit beginning and ending at a first location within said first kerf area, and
   said second via chain comprising a second electrical circuit beginning and ending at said first location within said first kerf area, such that said first via chain and said second via chain have the same single beginning/ending location.

2. The wafer structure according to claim 1, said via chain test structures being capable of being tested by focused ion beam testing.

3. The wafer structure according to claim 1, said geometrically shaped portions comprising rectangles, alternating geometrically shaped portions of said first via chain and geometrically shaped portions of said second via chain forming a checker-board pattern in said first kerf area.

4. The wafer structure according to claim 1, said geometrically shaped portions comprising one of:
   geometric structures, which alternate by type, across two or more layers of said first kerf area; and
   serpentine and comb structures which alternate in type or instance in the same plane of said first kerf area.

5. The wafer structure according to claim 1, said geometrically shaped portions of said first via chain and geometrically shaped portions of said second via chain repeating in said first kerf area to from an array of geometrically shaped portions.

6. A wafer structure comprising:
   integrated circuit chips;
   kerf areas located between said integrated circuit chips; and
   via chain test structures in said kerf areas,
   said via chain test structures comprising a first via chain and a second via chain located in a first kerf area,
   geometrically shaped portions of said first via chain and geometrically shaped portions of said second via chain comprising one of: triangles, rectangles, pentagons, hexagons, heptagons, octagons, circles, and ovals,
   said geometrically shaped portions of said first via chain and geometrically shaped portions of said second via chain alternating along a length of said first kerf area,
   said first via chain being electrically insulated from said second via chain to allow relatively lower magnification testing to identify a defective geometrically shaped portion containing a defective via structure, and relatively higher magnification testing to be performed only within said defective geometrically shaped portion,
   said relatively high magnification testing is slower and more destructive than said relatively low magnification testing,
   said first via chain comprising a first electrical circuit beginning and ending at a first location within said first kerf area, and
   said second via chain comprising a second electrical circuit beginning and ending at said first location within said first kerf area, such that said first via chain and said second via chain have the same single beginning/ending location.

7. The wafer structure according to claim 6, said via chain test structures being capable of being tested by focused ion beam testing.

8. The wafer structure according to claim 6, said geometrically shaped portions comprising rectangles, alternating geometrically shaped portions of said first via chain and geometrically shaped portions of said second via chain forming a checker-board pattern in said first kerf area.

9. The wafer structure according to claim 6, said geometrically shaped portions comprising one of:
   geometric structures, which alternate by type, across two or more layers of said first kerf area; and
   serpentine and comb structures which alternate in type or instance in the same plane of said first kerf area.

10. The wafer structure according to claim 6, said geometrically shaped portions of said first via chain and geometrically shaped portions of said second via chain repeating in said first kerf area to from an array of geometrically shaped portions.

11. A wafer structure comprising:
    integrated circuit chips;
    kerf areas located between said integrated circuit chips; and
    via chain test structures in said kerf areas,
    said via chain test structures comprising a first via chain and a second via chain located in a first kerf area,
    said first via chain being electrically insulated from said second via chain,
    geometrically shaped portions of said first via chain and geometrically shaped portions of said second via chain alternating along a length of said first kerf area,
    said first via chain being electrically insulated from said second via chain allows relatively lower magnification testing to identify a defective geometrically shaped portion containing a defective via structure, and relatively higher magnification testing to be performed only within said defective geometrically shaped portion,
    said relatively high magnification testing is slower and more destructive than said relatively low magnification testing,
    said first via chain comprising a first electrical circuit beginning and ending at a first location within said first kerf area, and
    said second via chain comprising a second electrical circuit beginning and ending at said first location within said first kerf area, such that said first via chain and said second via chain have the same single beginning/ending location.

12. The wafer structure according to claim 11, said via chain test structures being capable of being tested by focused ion beam testing.

13. The wafer structure according to claim 11, alternating geometrically shaped portions of said first via chain and geometrically shaped portions of said second via chain form a checker-board pattern in said first kerf area.

14. The wafer structure according to claim 11, said geometrically shaped portions comprising one of:
   geometric structures, which alternate by type, across two or more layers of said first kerf area; and
   serpentine and comb structures which alternate in type or instance in the same plane of said first kerf area.

15. The wafer structure according to claim 11, said geometrically shaped portions of said first via chain and geometrically shaped portions of said second via chain repeating in said first kerf area to from an array of geometrically shaped portions.

* * * * *